United States Patent [19]

Shibata et al.

[11] Patent Number: 4,970,548
[45] Date of Patent: Nov. 13, 1990

[54] IMAGE RECORDING APPARATUS

[75] Inventors: Eiji Shibata, Nagoya; Kazumasa Makino, Tsushima; Kazuhito Ishida, Nagoya, all of Japan

[73] Assignee: Brother Kogyo Kabushiki Kaisha, Aichi, Japan

[21] Appl. No.: 359,689

[22] Filed: May 31, 1989

[30] Foreign Application Priority Data

Jun. 3, 1988 [JP] Japan .................................. 63-74433

[51] Int. Cl.⁵ ............................................ G03B 27/58
[52] U.S. Cl. .......................................... 355/72; 355/27
[58] Field of Search ...................... 355/72, 73, 74, 75, 355/76, 27, 28; 354/275, 277; 226/180; 242/67.2, 67.3 R, 71.6, 71

[56] References Cited

U.S. PATENT DOCUMENTS

| | | | |
|---|---|---|---|
| 4,730,778 | 3/1988 | Akao et al. | 242/71 |
| 4,741,439 | 5/1988 | Bizic | 354/275 |
| 4,832,197 | 5/1989 | Hara | 355/72 |
| 4,855,791 | 8/1989 | Sawaki | 355/27 |

Primary Examiner—L. T. Hix
Assistant Examiner—Khanh Dang
Attorney, Agent, or Firm—Oliff & Berridge

[57] ABSTRACT

An image recording apparatus for recording an image corresponding to an original on a recording medium which is in the form of continuous elongate medium having a leading edge. The apparatus includes a main frame defining an internal space, a magazine detachably disposed within the internal space, a cartridge detachably mounted in the magazine for accommodating therein the recording medium, a take up roll disposed within the internal space for taking up the recording medium, a pair of feed rollers for feeding the recording medium along the sheet path, and a holding member having a first position for holding the leading edge and having a second position for releasing the leading edge. One of the feed rollers are movable to provide a first position for allowing the leading edge to pass through the rollers, and a second position for nipping the leading edge relative to the othr feed roller for feeding the recording medium along the sheet path. The holding member is positioned at the second position for releasing the leading edge of the recording medium when one of the feed rollers is positioned at the second position.

5 Claims, 3 Drawing Sheets

IMAGE RECORDING APPARATUS

BACKGROUND OF THE INVENTION

The present invention relates to an image recording apparatus and more particularly to an image recording apparatus using an elongate recording medium such as a photosensitive recording medium.

In general, a photosensitive recording medium as a recording medium is used in the image recording apparatus such as a copying machine. The image recording apparatus has been designed in such a manner that a photosensitive recording medium is exposed with light which is reflected from or transmitted through an original, and then the light-exposed photosensitive recording medium is developed to form an image corresponding to an original by the developing unit.

The photosensitive recording medium is generally in the form of roll-type continuous elongate sheet which is accommodated in a sheet roll cartridge or patrone. When loading the elongate recording medium to the image recording apparatus, after peeling off an adhesive tape fixing a leading edge of the photosensitive recording medium, a user or an operator draws out the photosensitive recording medium from the cartridge while holding its leading edge, and manually feeds the photosensitive recording medium to the developing unit along a sheet path. Thereafter the developing unit is driven, the leading edge portion of the photosensitive recording medium is manually inserted into the developing unit, and then the photosensitive recording medium is fed to the take up roll by the developing unit and wound around the take up roll.

However, in the conventional recording apparatus, it would be rather difficult or troublesome to manually load or set the elongate recording medium to the sheet path, since the sheet path is defined in meandered or intricate fashion by the various opposing rollers.

Further, for manually loading the recording medium to the recording apparatus, the operator may suffer from danger, since high voltage is applied to the recording apparatus.

SUMMARY OF THE INVENTION

The present invention has been made in view of the foregoing disadvantages, and accordingly, it is an object of the present invention to provide an image recording apparatus in which the elongate recording medium can be easily and reliably loaded to the sheet path in the recording apparatus and the elongate recording medium can be automatically fed along the sheet path.

In order to achieve the foregoing object, according to the present invention, there is provided an image recording apparatus for recording an image corresponding to an original on a recording medium, the recording medium being in the form of continuous elongate medium having a leading edge, the apparatus comprising; a main frame defining an internal space; a magazine detachably disposed within the internal space; a cartridge detachably mounted in the magazine for accommodating therein the recording medium; a take up roll disposed within the internal space for taking up the recording medium, a sheet path being defined between the magazine and the take up roll; a pair of feed rollers disposed within the internal space for feeding the recording medium along the sheet path, one of the feed rollers being movable to provide a first position for allowing the leading edge to pass through the rollers, and a second position for nipping the leading edge relative to the other feed roller; a holding member provided on the magazine, the holding member having a first position for holding the leading edge and having a second position for releasing the leading edge; and, a shift means for changing the positions of the holding member and the positions of one of the feed rollers.

The above and other object, features and advantages of the present invention will become more apparent from the following description when taken in conjunction with the accompanying drawings in which preferred embodiment of the present invention is shown by way of illustrative example.

DETAILED DESCRIPTION OF THE PREFERRED EMBODIMENT

An embodiment of this invention will be described below with reference to FIGS. 1 thru 3.

Figure 1:
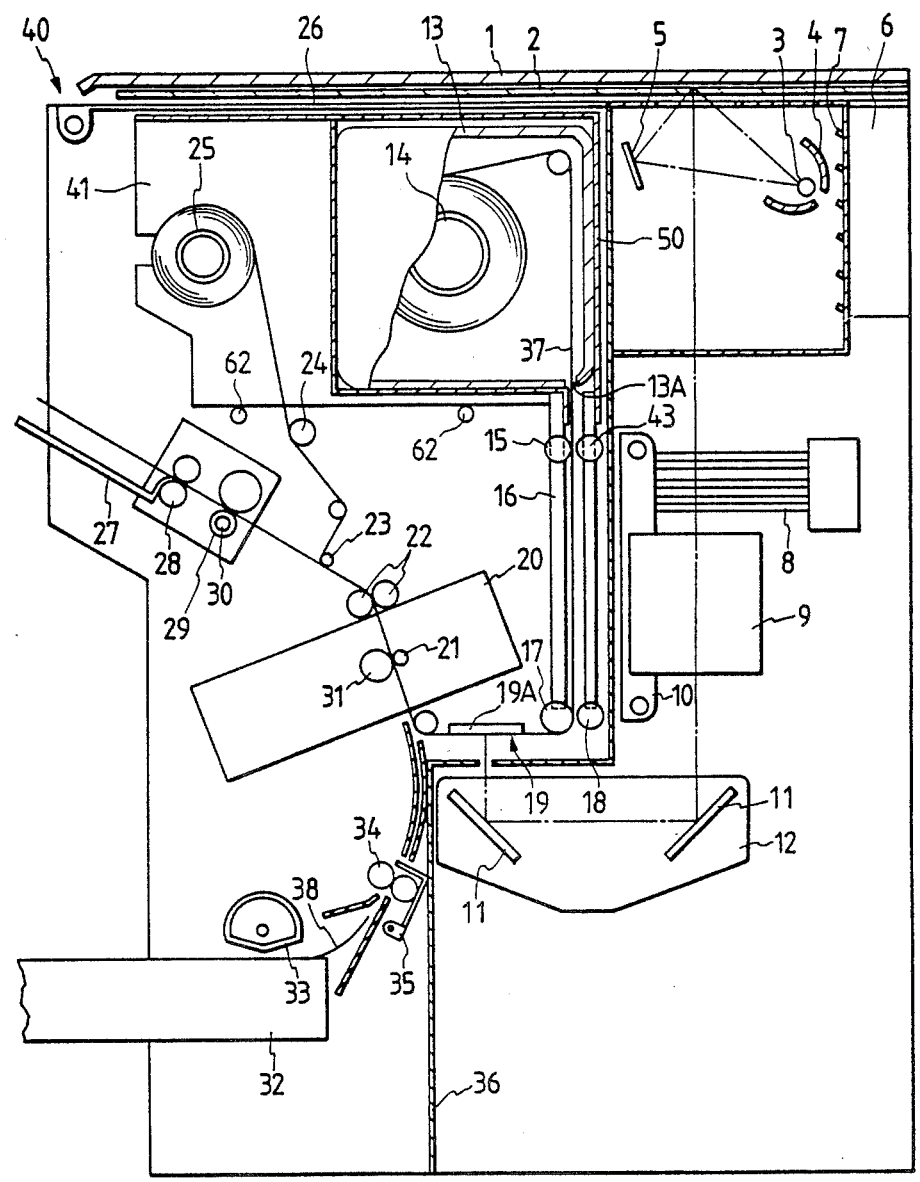
FIG. 1 is a schematic elevational view showing an image recording apparatus according to the present invention.

FIG. 1 shows a copying machine capable of performing a full-color copying. This copying machine employs the transfer type image recording mediums (which comprises a microcapsule sheet and a developer sheet) as described in U.S. Pat. No. 4,399,209 and Japanese Patent Application Kokai No. 58-88739.

First, an optical system and optical path in the copying machine 40 will be described. As shown in FIG. 1, the copying machine 40 has its top plate portion provided with a stand cover 1 and the original support stand glass 2. The original support stand glass 2 is formed of light transmissive material and is movable in the horizontal direction and on which a desired original (not shown) is to be placed. At the upper one side section (right side in FIG. 2) of the copying machine 40, there is fixedly provided light source including a linear halogen lamp 3 extending in the direction perpendicular to the moving direction of the original support stand glass 2, and a semi-cylindrical reflector 4 disposed to surround the lamp 3. The light source emits a linear-line light ray to the original support stand glass 2.

Therefore, the light emitted from the halogen lamp 3 can be sequentially irradiated on the entire surface over the region from the one to another ends of the original support stand glass 2 in accordance with the horizontal movement of the glass 2. The light from the light source passes through the transparent original support stand glass 2 and is reflected at the original mounted thereon. The original support stand cover 1 which covers the top surface of the glass 2 is provided in order to prevent this light from leakage out of the apparatus.

To irradiate the light from the halogen lamp 3 on the original at a high efficiency, a flat reflector 5 is disposed on one side of the light source. The flat reflector 5 is adapted to reflectingly direct lights which do not directly direct toward the original from the light source and concentrate such reflected light onto the original.

At another side of the halogen lamp 3 there are provided a fan 6 and a louver 7 for introducing an external air into the apparatus. Accordingly, air is effectively impinged onto the light source and the glass 2 to cool them.

A filter 8 is disposed below the original support stand glass 2. Further, a lens unit 9 is provided below the filter 8. Light emitted from the halogen lamp and reflected at the original placed on the original support stand glass 2 passes through the filter 8 and enters the lens 9. The filter 8 alters the light transmissive characteristic in accordance with the sensitivity characteristics of a microcapsule sheet 37, to thereby adjust the color tone of a copied output image. The lens 9 is fixedly secured to a lens mounting plate 10, and fine angular adjustment of this lens with respect to a light path is achievable.

A pair of reflection mirrors 11 and 11 are provided below the lens 9. The condensed lights passing through the lens 9 change their direction by 180 degrees (completely reverse direction) by the two reflection mirrors 11, and the thus oriented lights impinge on the microcapsule sheet 37 closely contacting the bottom of the exposure table 19A to form the latent image thereon. The two reflection mirrors 11 are securely mounted to a mirror mounting plate 12. The mirror mounting plate 12 is vertically movably connected to the main frame 41 of the apparatus 40, so that the adjustment of the length of the light path and focusing adjustment can be effected by fine adjustment of the position of the mirror mounting plate 12. The original (not shown), the filter 8, the lens 9, the pair of reflection mirrors 11 and the exposure table 19 define a U-shape or J-shape light path in combination.

The elongated web-like microcapsule sheet 37 is wound around a cartridge shaft 14 into a roll-type, and is retained in a microcapsule sheet cartridge 13 that is detachably disposed at a position immediately below an original support stand glass 2 and is formed with a bottom opening 13A. The exposure unit 19 is disposed below the sheet cartridge 13 at a downstream side thereof. The exposure unit 19 has an exposure stand 19A. An exposure zone of the exposure unit 19 is positioned quite adjacent to a developing zone of the pressure developing unit 20 as shown in FIG. 1. The sheet 37 passes through a number of rollers and the pressure developing unit 20, and a leading edge of the sheet 37 is attached to a take-up roll 25 positioned beside the sheet cartridge 13. A light shielding cover plate 16 is disposed between the cartridge 13 and the exposure unit 19 so as to maintain non-exposure state of the sheet 37 which is drawn from the opening 13A of the cartridge 13.

Between the sheet cartridge 13 and the exposure unit 19, a feed roller 15 and a barrel roller 17 are rotatably provided at a vertical sheet path for guide travel of the sheet toward the exposure unit 19. At the downstream side of the exposure unit 19, there is provided the pressure developing unit 20 which includes a small diameter roller 21 and a backup roller 31.

At downstream side of the pressure developing unit 20, a pair of feed rollers 22 are provided so as to provide constant running speed of the microcapsule sheet 37. This speed is coincident with a horizontally moving speed of the original support stand glass 2 so that linear latent images having given widths are sequentially formed on the microcapsule sheet 37 which is passing along the lower surface of the exposure table 19A. At downstream side of the feed rollers 22, there is provided a separation roller 23 by which the microcapsule sheet 37 is separated from the developer sheet 38. The separate microcapsule sheet 37 is taken-up by the above mentioned take up shaft 25 through a meander travel control roller 24.

At a lower portion of the apparatus 40, there is provided a developer sheet cassette 32 for storing therein a stack of developer sheets 38. Immediately above the cassette 32, a sector roller 33 is provided to feed each one of developer sheet 38 toward the pressure developing unit 20. Between the cassette 32 and the pressure developing unit 20, a roller 34 and a resist-gate 35 are provided so as to align leading edge of the developer sheet 38.

Accordingly, the microcapsule sheet 37 and the developer sheet 38 are fed, in close contact therewith, to the pressure developing unit 20. The microcapsule-carrying surface of the microcapsule sheet 37 on which a latent image is formed contacts the developer-coated surface of the developer sheet 38 at a position inside the pressure developing unit 20, and these superposed sheets are pressed together by the small roller 21 and the backup roller 31. Unexposed microcapsules are ruptured by the applied pressure, to thereby form an output image on the developer sheet 38 because of the reaction of chromogenic material with the developer material.

The microcapsule sheet 37 and developer sheet 38 leaving the pressure developing unit 20 are fed out by the feed rollers 22 and ar separated by the separation roller 23, the former sheet 37 directing upward and the latter sheet 38 directing in the straight direction.

On the other hand, thermal fixing unit 30 is provided at the downstream side of the separation roller 23. The thermal fixing unit 30 includes a hollow heat roller 29 in which a heater element 30 is disposed. Further, a developer sheet feed roller 28 is provided to feed the image fixed developer sheet 38 toward a discharge tray 27. The developer sheet 38 is subjected to thermal fixing in the thermal fixing unit 30 and is then discharged onto the discharge tray 27 with its image surface up.

Operation of the copying apparatus will be described:

First, the original support stand cover 1 is lifted up for mounting the original on the original support stand glass 2. Then, when a start button (not shown) is depressed, the original support stand glass 2 is moved to one direction (rightwardly in FIG. 1), so that one side edge of the glass 2 (left side edge in FIG. 1) stops at a first position where the one side edge of the glass 2 is coming into confrontation with the light source. Thereafter, with the halogen lamp 3 being lighted, the original support stand glass 2 is then moved leftwardly in FIG. 1. The light emitted from the halogen lamp 3 is reflected at the original, and the reflected light passes through the filter 8 and lens 9 and is reflected at two reflection mirrors 11. The last reflected light is finally directed toward the microcapsule sheet 37 which is located under the exposure table 19 to form the latent image on the sheet 37. At this time, since the microcapsule sheet 37 is moved under the exposure table 19 leftwardly in FIG. 1 at the same speed as the moving speed of the original support stand glass 2, the latent image corresponding to the original image is formed on the microcapsule sheer 37. Since the conveying speed for the microcapsule sheet 37 is controlled to be constant by feed rollers 22 and is set equal to the moving speed of the original support stand glass 2, linear latent images having given widths are sequentially formed on the microcapsule sheet 37 that is passing along the lower surface of the exposure table 19A.

The sheet 37 is then fed to the pressure developing unit 20 by the guide roller 17. At this time, the developer sheets 38 are fed out one by one by the sector or woodruff roller 33, and each sheet 38 is fed to a sheet inlet of the pressure developing unit 20 after leading edge of the sheet 38 is aligned by developer sheet rollers 34 and the resist gate 35. At the pressure developing unit, the sheet 37 is pressurizingly superposed with the developer sheet 38.

Accordingly, the microcapsule sheet 37 and the developer sheet 38 are fed, in close contact therewith, to the pressure developing unit 20. The microcapsule-carrying surface of the microcapsule sheet 37 on which a latent image is formed contacts the developer-coated surface of the developer sheet 38 at a position inside the pressure developing unit 20, and these superposed sheets are pressed together by the small roller 21 and the backup roller 31. Unexposed microcapsules are ruptured by the applied pressure, to thereby form an output image on the developer sheet 38 because of the reaction of chromogenic material with the developer material.

The microcapsule sheet 37 and developer sheet 38 leaving the pressure developing unit 20 are fed out by the feed rollers 22 and are separated by the separation roller 23, the former sheet 37 directing upward and the latter sheet 38 directing in the straight direction. Thereafter, the developer sheet 38 is subjected to thermal fixing in the thermal fixing unit 30 and is then discharged onto the discharge tray 27 with its image surface up.

Meanwhile, the microcapsule sheet 37 leaving the pressure developing unit 20 and passing through the separation roller 23 and the meandering control roller 24 is wound around the take-up roll 25. When the movement of the original support stand glass 2 is stopped at a second position where another edge (right side in FIG. 1) of the glass 2 confronts the light source, the copying of the original is completed and the halogen lamp 3 is turned off.

Next, a magazine device of the copying machine will be described below with reference to FIGS. 2 and 3.

At a upper portion of the copying machine 40, there is provided a magazine 41 which accommodates the take up shaft 25 and the cartridge 13. A magazine cover 50 is pivotably movably supported on one end of the magazine 41 through a supporting shaft 60. A holding member 42 is pivotably movably supported on lower end portion of the magazine cover 50 through a supporting shaft 52, and is normally urged in a clockwise direction by a coil spring (not shown). At a lower portion of the magazine 41, an arm 51 is fixedly provided through a shaft 52. The arm 51 is provided with, at its intermediate portion, a presser roller 56 which is pressed against the take up shaft 25 by self resiliency of the arm 51.

Holding pins 62 are fixedly provided on a main frame 63 of the machine 40 to receive and hold the magazine 41. On the back side of the main body 63, there are rotatably provided pulleys 58, 54, 47, 66 around which a belt 49 is wound to rotate them in synchronism with one another. To be specific, a shaft 61 is fixedly supported on the main frame 63, the pulley 58 is rotatably supported on the shaft 61. A lever 57 is fixed to the pulley 58 to allow the lever 57 to rotate together with the pulley 58. A shaft 53 is rotatably supported between two main frames 63 disposed in spaced apart relation (only one main frame is depicted in FIGS. 2 and 3) and has one end fixedly holding the pulley 54. A guide member 55 is secured to the shaft 53 to allow the guide member 55 to rotate together with the shaft 53. A shaft 64 is rotatably supported between two main frames 63, and the pulley 66 is fixedly supported on the shaft 64 through a one-way clutch (not shown in the drawing), so that the shaft 64 is rotated together with the pulley 66 in a clockwise direction. An engaging member 65 is fixed to the shaft 64 which is normally urged in a clockwise direction by a coil spring (not shown).

A shaft 61 is fixedly supported between two main frames 63, and the pulley 47 and a cam 48 are rotatably supported on the shaft 61 so that the cam 48 is rotated together with the pulley 47. A shaft 45 is rotatably supported between main frames 63, and a cam follower 46 is fixed to the shaft 45 at the backside of the main frame 63. Between the main frames 63 there is fixedly provided an arm 44 on which a feed roller 43 is rotatably supported. A current limit switch SW is provided adjacent the lever 57 to control a motor for rotating the feed roller 15.

Operation of the magazine device thus constructed will described below reference to FIGS. 2 and 3.

The take-up roll 25 and the cartridge 13 are accommodated and loaded in the magazine 41 positioned outside the copying machine 40, thereafter, the magazine cover 50 is closed. At this time, the leading edge of the microcapsule sheet 37 is nipped and held by the holding member 42 and the holding portion 41a of the magazine 41 as shown in FIG. 2. And the leading edge of the microcapsule sheet 37 is adjusted by the user so that the leading edge of the sheet 37 is positioned in normal direction with respect to the longitudinal direction of the sheet 37.

Next, the magazine 41 accommodating the take-up roll 25 and the cartridge 13 is inserted into the copying machine 40 and supported by the holding pins 62. When the lever 57 is rotated in a clockwise direction in order to feed the sheet 37, the pulley 58 is rotated in a clockwise direction, to thereby rotate pulleys 54, 47, and 66 through the belt 49. The rotation of the pulley 54 causes the guide member 55 to rotate, and the rotation of the pulley 66 causes the engaging member 65 to pivotally move against urging force of the coil spring, to thereby push up the holding member 42. On the other hand, the cam 48 is rotated together with the pulley 47 in a clockwise direction, the cam follower 46 is rotated together with the shaft 45 in a counterclockwise direction. As a result, the arm 44 is swingingly moved in a counterclockwise direction, another feed roller 43 supported on the tip end of the arm 44 is moved toward the feed roller 15 in order to nip the microcapsule sheet 37.

Figure 2:
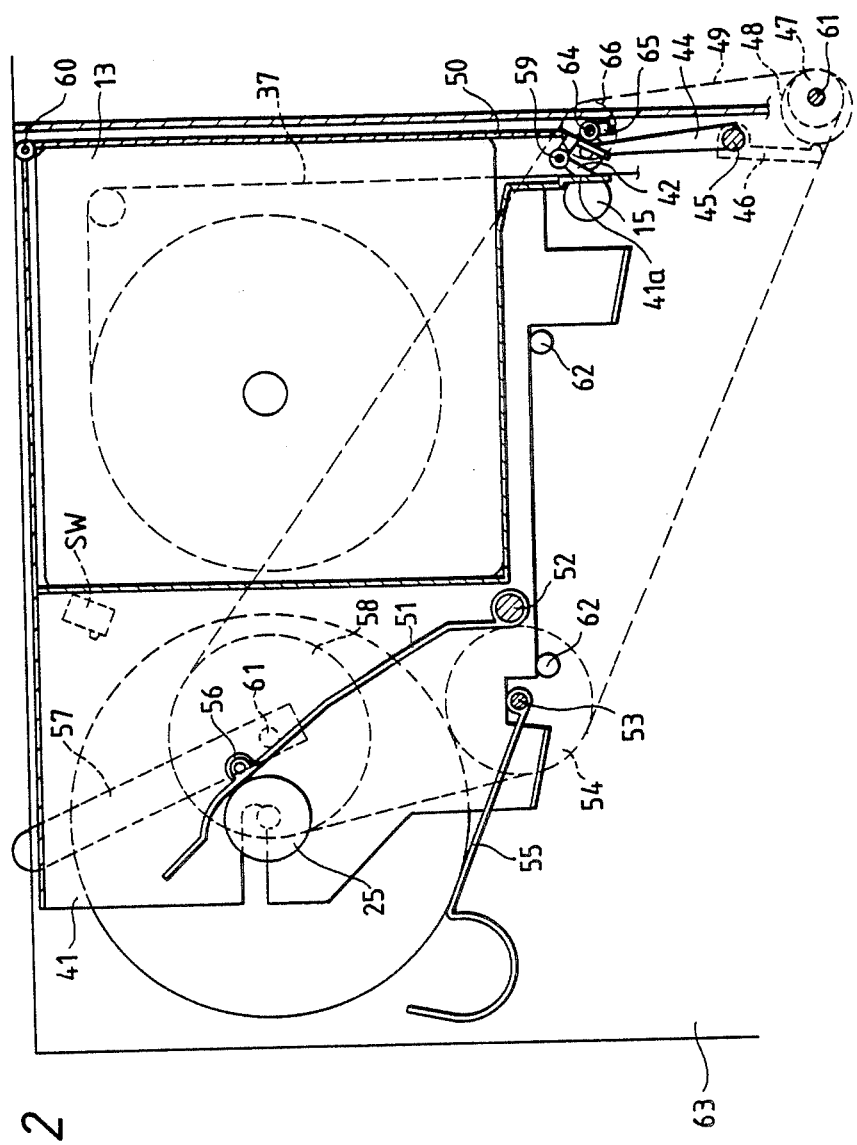
FIG. 2 is an enlarged schematic elevational view showing a magazine device according to the present invention; and, FIG. 3 is an enlarged schematic elevational view showing operation according to the present invention.

Since pulleys each having a predetermined diameter, the engaging member 65, the holding member 42, the cam 48 and the cam follower 46 are jointly assembled as shown in FIG. 2, the microcapsule sheet 37 is disengaged from the holding member 42 by rotating the holding member 42 in a counterclockwise direction after nip of the feed rollers 43, 15 is finished.

Figure 3:
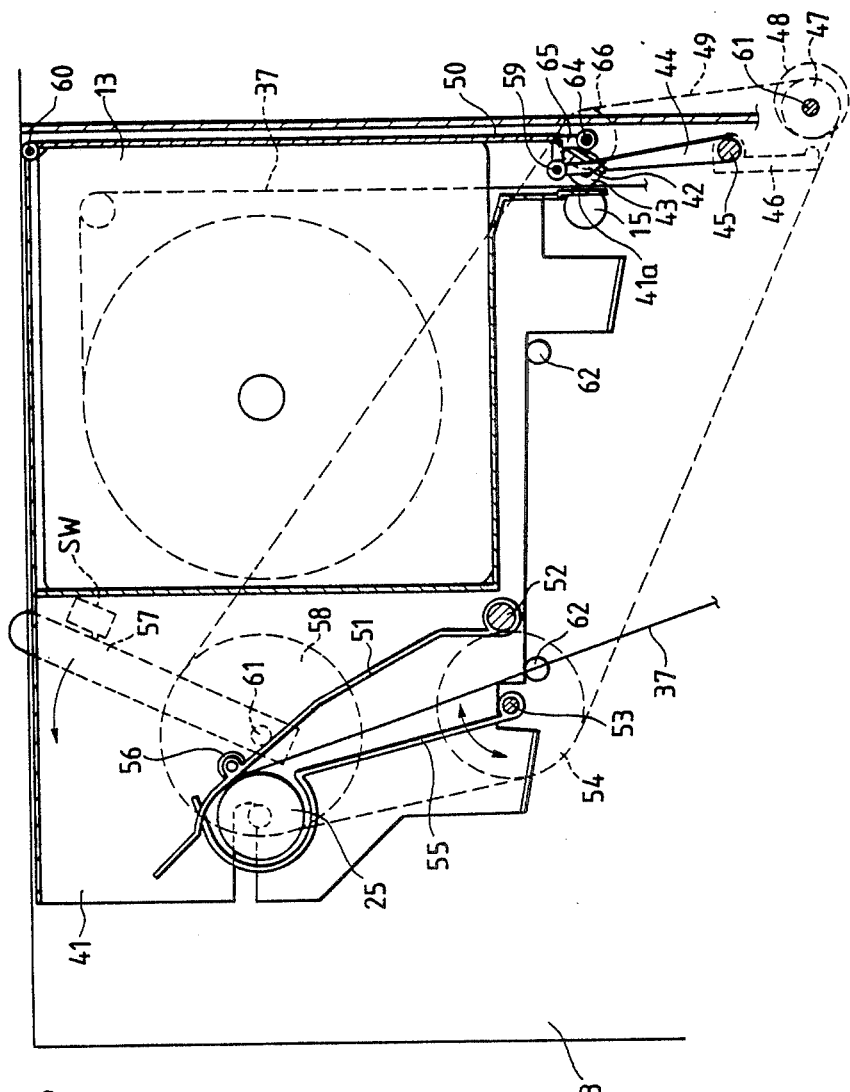

As shown in FIG. 3, when the lever 57 is rotated in a clockwise direction the current limit switch SW is rendered ON. In this state, the microcapsule sheet 37 is wound around the take-up roll 25 in cooperation with the presser roller 56 and the guide member 55 after the microcapsule sheet 37 is fed toward the take-up roll 25 passing through a sheet path. After the leading edge of the microcapsule 37 is wound around the take-up roll 25 more than one revolution, the lever 57 is rotated in a counterclockwise direction. Since the engaging member 65 is interlinked to the pulley 66 through the one-way clutch, the engaging member 65 is kept stationary in a state engaging with the holding member 42, so that the microcapsule sheet 37 is kept on being disengaged from the holding member 42. The remaining components, however, return to an original condition as shown in FIG. 2.

When the magazine 41 is detached from the copying machine 40, the engaging member 65 is disengaged from the holding member 42 to thereby allow the engaging member 65 and the holding member 42 to return to their original condition as shown in FIG. 2.

As will be apparent from the aforementioned description, according to the present invention, the elongate recording medium can be easily and reliably loaded to the sheet path in the recording apparatus and the elongate recording medium can be automatically fed along the sheet path stably.

The foregoing embodiment concerns the image recording apparatus using the elongate microcapsule sheet as the photosensitive recording medium. However, the present invention is also available for other type of the elongate recording medium.

While the invention has been described with reference to specific embodiment thereof, it would be apparent for those skilled in the art that various changes and modifications can be made therein without departing from the spirit and scope of the invention.

What is claimed is:

1. An image recording apparatus for recording an image corresponding to an original on a recording medium, said recording medium being in the form of continuous elongate medium having a leading edge, said apparatus comprising;
    a main frame defining an internal space:
    a magazine detachably disposed within said internal space;
    a cartridge detachably mounted in said magazine for accommodating therein said recording medium;
    a take up roll disposed within said internal space for taking up said recording medium, a sheet path being defined between said magazine and said take up roll;
    a pair of feed rollers disposed within said internal space for feeding said recording medium along said sheet path, one of said feed rollers being movable to provide a first position for allowing the leading edge to pass through said rollers, and a second position for nipping said leading edge relative to the other feed roller;
    a holding member provided on said magazine, said holding member having a first position for holding said leading edge and having a second position for releasing said leading edge; and
    a shift means for changing said positions of said holding member and said positions of one of said feed rollers.

2. An image recording apparatus as defined in claim 1, wherein said shift means changes said positions of said holding member and said positions of one of said feed rollers so that said holding member is positioned at said second position when said one of said feed rollers is positioned at said second position.

3. An image recording apparatus as defined in claim 1, wherein said magazine comprises a magazine body and a magazine cover, said holding member is provided on said magazine cover so that said holding member is positioned at said first position when said magazine cover is closed.

4. An image recording apparatus as defined in claim 1, wherein said magazine body is provided with a holding portion for holding said leading edge of said recording medium in cooperation with said holding member.

5. An image recording apparatus as defined in claim 1, wherein said shift means comprises an engaging member interlinked to a driving source through one-way clutch and being engageable with said holding member, and a cam mechanism interlinked to a driving source and driving said one of feed roller.

* * * * *